United States Patent [19]

Pexa

[11] Patent Number: 4,734,768
[45] Date of Patent: Mar. 29, 1988

[54] METHOD FOR TRANSMITTING DIFFERENTIAL PULSE CODE MODULATION (DPCM) VALUES

[75] Inventor: Guenther Pexa, Woerthsee, Fed. Rep. of Germany

[73] Assignee: Siemens Aktiengesellschaft, Berlin and Munich, Fed. Rep. of Germany

[21] Appl. No.: 43,823

[22] Filed: Apr. 29, 1987

[30] Foreign Application Priority Data

Apr. 30, 1986 [DE] Fed. Rep. of Germany ....... 3614690

[51] Int. Cl.$^4$ .................... H04N 7/137; H04B 14/04; H04B 14/06
[52] U.S. Cl. ............................ 358/135; 340/347 DD; 370/83; 375/27
[58] Field of Search ........................ 358/133, 135, 136; 375/27, 122; 370/83; 340/347 DD

[56] References Cited

U.S. PATENT DOCUMENTS

| | | | |
|---|---|---|---|
| 4,205,200 | 5/1980 | Parikh | 370/83 |
| 4,563,671 | 1/1986 | Lim | 340/347 DD |
| 4,583,237 | 4/1986 | Haskell | 375/27 |
| 4,591,909 | 5/1986 | Kuroda | 358/136 |
| 4,645,916 | 2/1987 | Raisleger | 340/347 DD |
| 4,685,115 | 8/1987 | Akagiri | 358/135 |
| 4,691,233 | 9/1987 | Acampora | 358/135 |

FOREIGN PATENT DOCUMENTS 3403307 8/1985 Fed. Rep. of Germany.

OTHER PUBLICATIONS

Chen et al, "Storage-Efficient Representation of Decimal Data", Comm. of the ACM, Jan. 1985, vol. 18, No. 1, pp. 49–52.
Atal et al, "Improved Quantizer . . . Low Bit Rates", ICASSP 80 Proceedings, vol. 2, pp. 535–538.
Kasteff, H., "Efficient Character . . . Computers", Computer Design, Apr. 1973, vol. 12, No. 4, p. 98.
Cohn et al, "The Residual Encoder . . . Digitization", IEEE Trans. on Communications, vol. COM-23, No. 9, Sep. 1975, pp. 935–941.

Primary Examiner—Howard W. Britton
Attorney, Agent, or Firm—Hill, Van Santen, Steadman & Simpson

[57] ABSTRACT

A method for transmitting DPCM values provides that a plurality of successive DPCM values are converted into data words of identical, optimally-minimal length and are combined with a preamble identifying the word length, the combination being undertaken to form a data block of constant length for transmission.

10 Claims, 7 Drawing Figures 5.1 0 a a a a a a a a a
5.2 1 0 b b b b b b b b
5.3 1 1 0 c c c c c c c c
5.4 1 1 1 0 PCM
5.5 1 1 1 1 0 RL
5.6 0 1 1 0 0 0 0 1 0 1 P
5.7 1 1 1 1 1 1 0 c c c c 6.1 0 a a a a a a a a a
6.2 1 1 b b b b b b b b
6.3 1 0 1 c c c c c c c c
6.4 1 0 0 PCM
6.5 0 0 0 0 0 1 RL
6.6 0 1 1 0 0 0 0 1 1 0 1
6.7 0 1 1 0 0 0 0 1 0 1 0
                              P

METHOD FOR TRANSMITTING DIFFERENTIAL PULSE CODE MODULATION (DPCM) VALUES

BACKGROUND OF THE INVENTION

Field of the Invention

The present invention is directed to a method for transmitting differential pulse code modulated (DPCM) values by data words of different length.

In the transmission of digitized samples, a differential pulse code modulation method is frequently applied for data reduction. The original signal, involving, for example, an audio signal or a video signal, is first converted into an electrical signal, is sampled and is subsequently digitized. Instead of the digitized samples acquired in this manner, only the respective difference of the current sample relative to an estimated value calculated from the preceding samples is transmitted. To this end, the difference referred to as a DPCM value is first quantized and subsequently transmitted as a coded DPCM word. It is known for further data reduction, to take what is referred to an optimal coding, for example, according to Shannon-Fano or Huffman, wherein the frequency of the appearance of individual code words is taken into consideration. The irregular data flow thereby caused requires a considerable circuit expense in the reconstruction of the original samples at the receiver. Moreover, this method is susceptible to disruption given transmission errors and only effects a relatively slight data reduction.

SUMMARY OF THE INVENTION

An object of the invention is to provide a simply realizable method for coding DPCM values which requires only simple measures for synchronization and also causes an appreciable data reduction.

The above object is achieved, according to the present invention, by a method which is particularly characterized in that a plurality of successive DPCM values are converted into data words of identical, optimallyminimum lengths, and in that the data words are combined with a preamble identifying their lengths to form a respective data block of constant length and are transmitted.

According to a feature of the invention, the method is also characterized in that an unused binary combination is transmitted as a control signal instead of a DPCM value converted into a data word.

According to another feature of the invention, a PCM signal value having an appertaining preamble is transmitted in a data block instead of DPCM values.

According to another feature of the invention, a data block containing a synchronizing word is transmitted at the beginning of a television line.

According to another feature of the invention, a predictor identifier is transmitted in the data block in addition to the synchronizing word.

According to another feature of the invention, a run-length coding comprising the number of DPCM values corresponding to the value zero are transmitted in a data block with an appertaining preamble.

According to another feature of the invention, the transmission of DPCM values occurs by data words comprising respectively 2, 3 and 4 bits.

According to a further feature of the invention, data blocks are transmitted which have a length of 11 bits.

According to another feature of the invention, a conversion of the data words into DPCM values is undertaken at the receiver, the DPCM values being supplied to a DPCM receiver which reconstructs PCM signal values.

According to another feature of the invention, a block length of 14 bits, including a preamble of at least 2 bits, is provided.

A simple synchronization is already possible by way of the constant block formation. By combining data words of identical lengths to form a respective data block, only a minimal additional information is required for identifying the word boundaries.

Even given great transmission disturbances, a synchronization between a transmitter and a receiver is possible on the basis of a synchronizing word which, for example, is transmitted at the beginning of each video line.

Due to the transmission of PCM words, moreover, critical picture portions are transmitted with extremely-high quality and the data rate to be transmitted is reduced even more by a run-length coding given uniform picture signals. The transmission of control signals also always enables an optimum employment of different predictors or, on the other hand, of different quantization possibilities, whereby the control criteria need not be derived from the received DPCM values.

BRIEF DESCRIPTION OF THE DRAWINGS

Other objects, features and advantages of the invention, its organization, construction and operation, will be best understood from the following detailed description, taken in conjunction with the accompanying drawings, on which.

DESCRIPTION OF THE PREFERRED EMBODIMENTS

Figure 1:
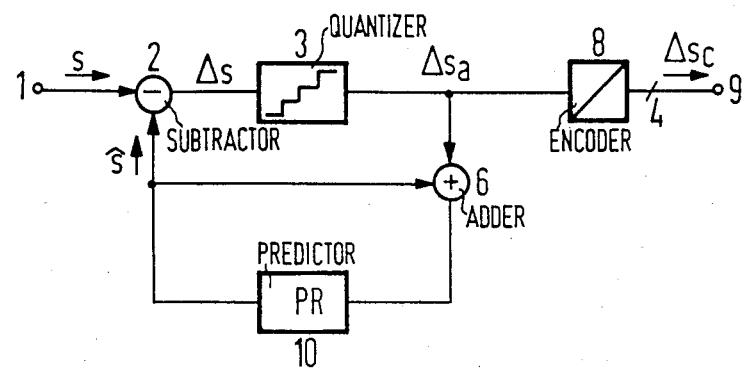
FIG. 1 is a schematic representation of a DPCM transmitter.

FIG. 1 illustrates a fundamental circuit diagram of a DPCM transmitter. The input 1 is connected to a subtractor 2 whose output is connected to the input of a quantizer 3. The output of quantizer 3 is fed back by way of an adder 6 and a predictor 10 to the subtraction input of the subtractor 2. The output of the predictor 10 is also connected to a second input of the adder 6. An encoder 8 whose output is reference 9 is also connected to the output of the quantizer 3.

The method of the present invention shall be set forth below with reference to the transmission of television signals. For reasons of simplification, a distinction between luminance and chrominance signals will not be made here, these generally being coded in various DPCM transmitters and being transmitted in accordance with time-division multiplex techniques.

Digitized samples s correspond to picture elements and are supplied to the input 1. The respective difference between a sample s and a predicted value H is formed in the subtractor 2 and the DPCM value Δs identified in this manner is supplied to the quantizer 3 which emits quantized DPCM values $\Delta s_a$ at it output. In the encoder 8, these signal are converted into coded DPCM values $\Delta s_c$ which, for example, comprise a length of four bits. The output 9 leads to the modulation apparatus of the DPCM transmitter.

It is also known to control quantizer 3 and the encoder dependent on the samples and to undertake an optimal coding of the quantized DPCM values $\Delta s_a$.

Figure 2:
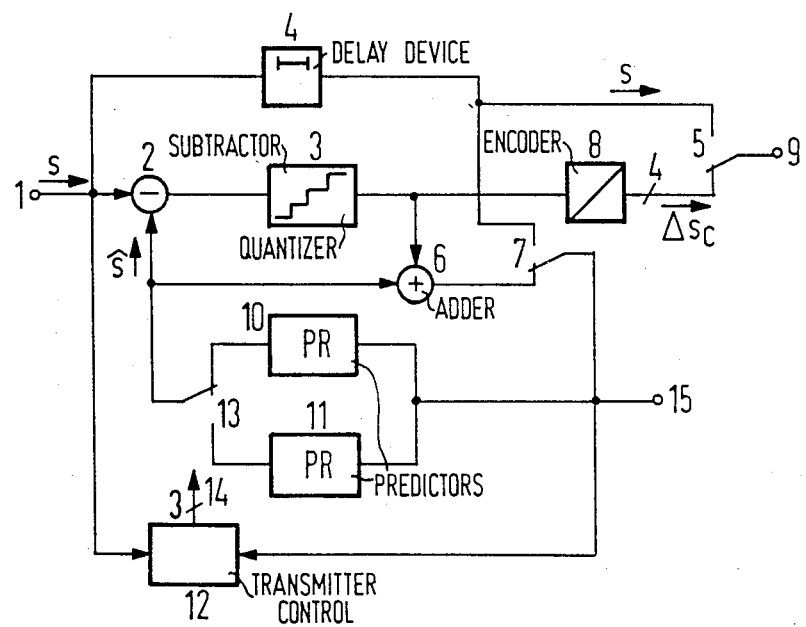
FIG. 2 is a schematic representation of a switchable DPCM transmitter.

FIG. 2 illustrates an expanded fundamental circuit diagram of a switchable DPCM transmitter which is intended to serve for explaining the method of the present invention.

The input 1 is again connected to the series circuit of a subtractor 2 and a quantizer 3. By way of a transfer device 7, whose second input is connected to the input 1 via a delay device 4, however, the output of the adder 6 is connected to the inputs of two predictors 10 and 11, as well as to the input of a transmitter control 12 which here comprises a further input which is connected to the input 1 of the DPCM transmitter. The respective output of one predictor is fed back via a further transfer device 13 to the subtraction input of the subtractor 2. Moreover, a third transfer device 5 is provided, this optionally thru-connecting the output of the encoder 8 or the output of the delay device 4 to the output 9 of the DPCM transmitter. The input 16 of an encoder device is connected to the output 9, the encoder device being illustrated in FIG. 3. The input 16 is connected to the inputs of an encoder control 18, a shift register 17, and a counter 19. The outputs of the encoder control, of the shift register and of the counter are connected to parallel inputs of an arrangement 20 for encoding data blocks, which is referred to, in short, as an encoder. The output 21 of the encoder is followed by a buffer 22 (FIFO: first in-first out) and may be followed by a forward error correction (FEC) encoder 23 which emits protected data at its output 24. In a block-by-block data protection, the sequence of the buffer and the FEC encoder is advantageously interchanged.

Figure 3:
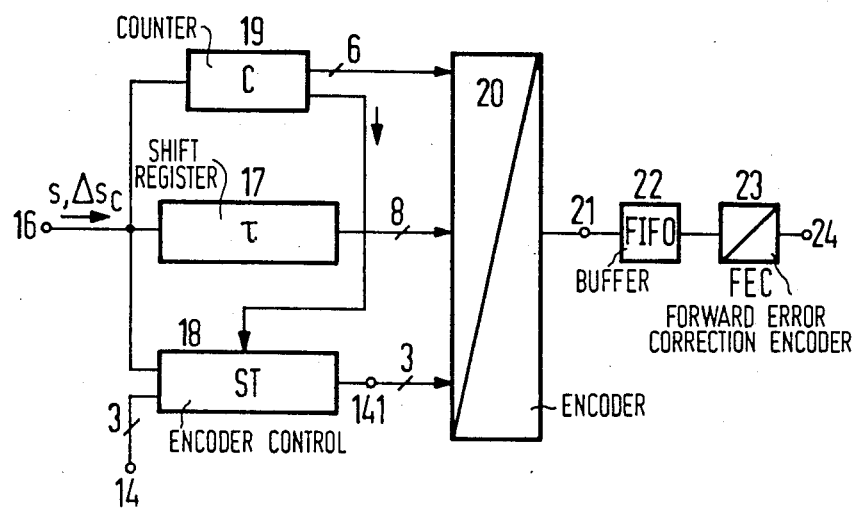
FIG. 3 is a schematic representation of an apparatus for coding in accordance with the present invention.

Before the operation of the encoder device of FIG. 3 is set forth in greater detail, the desired combination of the DPCM values output by the DPCM encoder to form data blocks shall first be set forth in greater detail with reference to FIGS. 5 and 6. One may thereby proceed from the following considerations. When, of, respectively, 16 or 15 possible values (corresponding to the possible binary combinations given a word length of four bits) the DPCM values output by the encoder 8 respectively encompass only a few values, for example only the three values 0, +1 and −1, which are lowest in terms of magnitude and which correspond to three amplitude levels (steps), then these three values can be encoded with only two bits "aa". Five of these DPCM values are combined with a preamble encompassing only one bit to form data block in accordance with FIG. 5, line 5.1. When a DPCM value of a data block corresponds to a greater amplitude value, then the encoding occurs with three bits "bbb" whereby respectively three DPCM values are combined with a preamble encompassing two bits to form a data block which is likewise 11 bits long. If this is also impossible due to too great a DPCM value, then the original word length of four bits "cccc" must be retained and an encoding must occur in accordance with FIG. 5, line 5.3 wherein the preamble now encompasses three bits. An attempt is therefore always made to combine the greatest possible number of DPCM values in a data block, whereby the DPCM value greatest in terms of amount determines the plurality of bits to be expanded for the encoding of all data words of the data block. The preambles are selected such that the corresponding data blocks are unambiguously identified.

A considerable data reduction in a DPCM transmitter of the type illustrated in FIG. 1 can already be achieved with the encoding set forth above. The method of the present invention, however, also allows more complicated encoding processes to be advantageously carried out with the expanded DPCM transmitter of FIG. 2, whereby, of course, not all of the encoding possibilities described below must be utilized.

Figures 5, 6, 7:
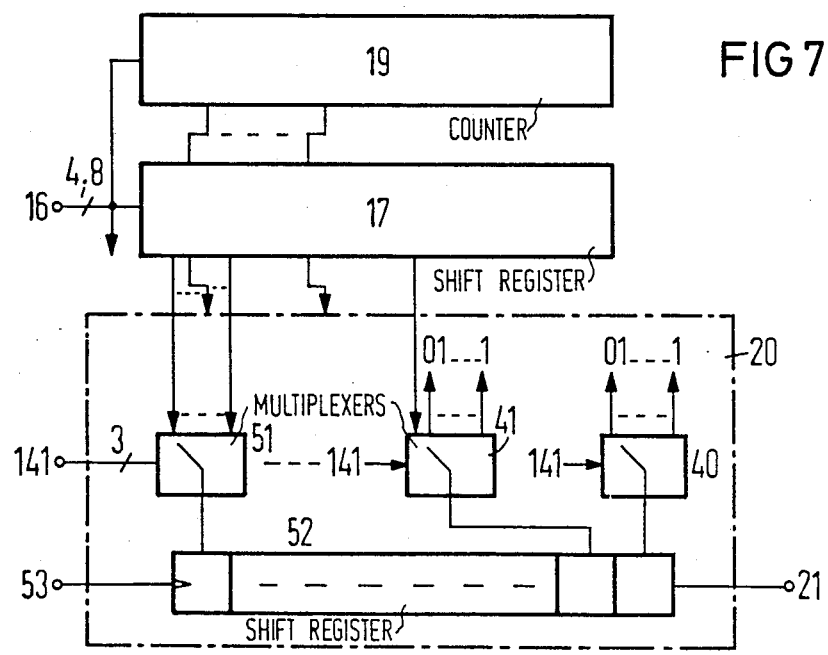
FIG. 5 is a graphic illustration of an example for coding data blocks.
FIG. 6 is a graphic representation of another example of coding of data blocks.
FIG. 7 is a basic circuit diagram of an arrangement for coding data blocks.

Instead of a DPCM value, the transmission of a PCM value in accordance with FIG. 5, line 5.4 can occur during a critical picture portion (for example, picture edges, raster). In accordance with line 5.5 of FIG. 5, the transmission of the number of picture elements wherein the samples do not change and the DPCM values are therefore zero, usually referred to as run-length coding "RL", can likewise be undertaken given picture portions that remain the same. Further, a synchronizing word, as in FIG. 5, line 5.6, can be transmitted at the beginning of each television line, whereby the data block also comprises one or more bits as predictor identification P in addition to the synchronizing word. In accordance with line 5.7 of FIG. 5, a specific preamble can also be provided, this indicating that only a single DPCM value is being transmitted, whereby this DPCM value can also comprise more than the usual four bits for the transmission of extreme differences. The number of transmission possibilities is not yet exhausted in the indicated examples. Therefore, identified by a special preamble, control signals can also be transmitted, these corresponding to the selection of a specific predictor or, for example, switching the quantizer. An especially interesting modification shall be set forth in yet greater detail. When all possible combinations need not be transmitted, for example the DPCM values of FIG. 5, line 5.1, only assume the values 01, 10 and 11, then the remaining combination 00 here can be transmitted as a control character. The same is also true with respect to lines 5.2 and 5.3 wherein the control character corresponds to "000" or, respectively, "0000".

Under the condition that one bit combination is reserved for control signals, FIG. 6 sets forth particularly favorable coding form wherein two preambles, each only three bits long, are provided in lines 6.3 and 6.4, whereby a PCM word eight bits long can be transmitted. The preamble provided in line 6.5 cannot be simulated by a specific bit combination of line 6.1 since the preamble contains two successive control signals, but two successive control signals are never output at the transmission side. The control signal is advantageously employed for switching beween two predictors, whereby one predictor carries out an interframe encoding (two-dimensional) and the other carries out an interframe encoding (upon utilization of the preceding television picture) or an interfield encoding.

The same number of picture elements must be transmitted in each television line. At the end of a television line, therefore, it can be necessary that only a single DPCM value is to be transmitted. An encoding in accordance with line 5.7 of FIG. 5 is then to be considered; however, a PCM value can likewise be transmitted instead of a DPCM value, or a combination of a DPCM value of line 5.3 of FIG. 5 or line 6.3 of FIG. 6 and a control signal that remains ineffective at the end of a television line when the predictor is newly-selected at the next line start. The same problem derives correspondingly in the transmission of a PCM value when only a single DPCM value is to be transmitted before that value. This problem can occur due to an encoding in accordance with line 5.7 of FIG. 5, due to the transmission of two PCM values or due to the transmission of the number 0 in a run-length encoding in accordance with line 5.5 of FIG. 5 or line 6.5 of FIG. 6.

The combination of DPCM values to form data blocks definitely need not occur in the form set forth above. The identification of the data blocks, for example, can also ensue in that, of all possible combinations, $2^{10}$ combinations for the transmission of two data are selected in accordance with line 5.1 of FIG. 5, or respectively, line 6.1 of FIG. 6. For the transmission of data blocks in accordance with line 5.2 of FIG. 5, or respectively, line 6.2 of FIG. 6, $2^9$ combinations are provided, etc. Given this procedure, however, a higher circuit-oriented expense is required.

The data block lengths should be selected to be neither excessively great nor excessively small and should lie between 10 and 20 bits. Other than the data block length of 11 bits as set forth above by way of example, a block length comprising 14 bits also seems particularly suited, whereby at least two bits are provided for the preamble.

The switchable DPCM transmitter illustrated in FIG. 2 executes the encoding alternatives set forth above. The suitable predictor 10, 11 is selected via the transfer device 13 and the transfer device 5 enables the emission of a PCM value which supplies the PCM value to the predictors via the transfer device 7, in order to guarantee synchronism with the DPCM receiver.

In FIG. 3 the input 16 of the encoder device is supplied with DPCM values encoded with the same length of four bits and with PCM values comprising eight bits, being supplied therewith from the output of the expanded DPCM transmitter. These are written into the shift register 17, whereby the encoder control 18 is simultaneously informed of the type of values involved. A total of five DPCM values or PCM values are stored in the shift register. The encoder control simultaneously checks to see how many bits are respectively required for encoding DPCM values. When, for example, only two bits are required given five succeessive DPCM values, then the encoding can occur in accordance with line 5.1 of FIG. 5. A preamble "0" is placed in front of the encoded data words in the encoder 20 and the overall data block is emitted serially or in parallel. When, however, three or four bits are required for encoding the fourth DPCM value, the first three DPCM values are converted into data words each having three bits in accordance with line 5.2 of FIG. 5 or line 6.2 of FIG. 6 and the fourth DPCM value is transmitted together with the following DPCM values in the following data block. Moreover, the counter 19 constantly checks to see how frequently no change of the samples or, respectively, DPCM values "0" occur in succession. When this is the case in more than five DPCM values, then the run-length encoding of line 5.5 of FIG. 5 is carried out. Control signals which are supplied via the input 14 of the encoder 18 can likewise be recoded into corresponding data blocks via the encoder 20. The encoder control also initiates the emission of the frame identification word.

The buffer 22 sees to a continuous data flow at its output, whereby it controls, for example, the quantizer or the encoder device as well in a known manner dependent on its degree of fill. The transmitted data are protected against disturbances on the transmission paths by the FEC encoder 23. The protection can thereby be limited to the preamble and to the more significant bits.

FIG. 7 shows the encoder 20 in detail. It essentially contains a shift register 52 which comprises 11 trigger circuits connected in series. A plurality of multiplexers 40–51 are inserted at parallel inputs of the shift register 52. The inputs of the first multiplexers 40 are connected to fixed potentials which correspond to the logic states indicated in the first column of FIG. 5. The second multiplexer 41, first of all, has the job of storing the first information bit following the preamble in accordance with line 5.1 of FIG. 5 into the shift register and is therefore connected to a corresponding output of the shift register 17. All further inputs of this multiplexer are again connected to fixed potentials in accordance with the second column of FIG. 5. Correspondingly, the inputs of the further multiplexers are connected to the outputs of the shift register 17 and the outputs of the counter 19 or are likewise connected to fixed potentials. The control of the multiplexers occurs from the output 141 of the encoder control 18. Up to, eight different types of code blocks can be realized with three control lines. On the basis of a clock applied to the input 53, the shift register 52 can be simultaneously used as a parallel-to-serial converter, whereby the data are output in serial form at the output 21. Of course, other possible realizations of the encoder are conceivable.

Figure 4:
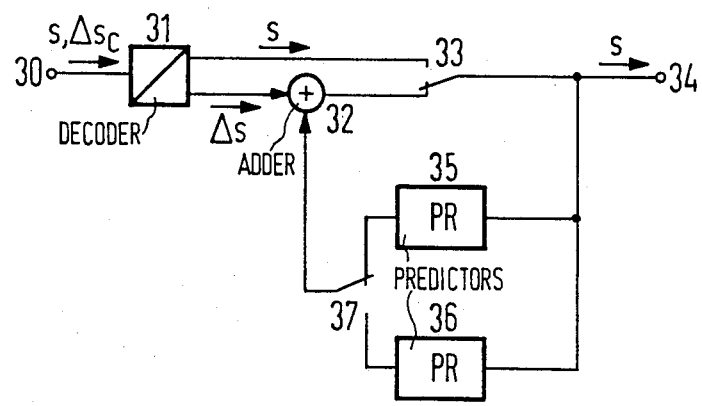
FIG. 4 is a basic circuit diagram of a DPCM receiver.

The DPCM receiver has the job of converting the received code blocks back into sample. FIG. 4 illustrates such a DPCM receiver. The data blocks are supplied to a decoder 31 via an input 30. The decoder 31 contains an elastic memory and a decoder arrangement, so that the DPCM values $\Delta s$ or samples s are output at the outputs of the decoder. Both outputs are connected to an output 34 by way of a transfer device 33. The output is fed back to an adder 32 via two predictors 35 and 36, as well as via a transfer device 37, the adder 32 also being supplied with the DPCM signals $\Delta s_c$. The sample s are reconstructed from a DPCM values $\Delta s$ in the DPCM loop. The output 34 thereby corresponds to the local output 15 of the DPCM transmitter. The activation of the transfer devices 33 and 37 likewise occurs proceeding from the decoder device. Details in the illustration of the DPCM receiver have been omitted since this exhibits a function corresponding to that of the DPCM transmitter. Devices for synchronization to the frame recognition word and to a specific block length are likewise not shown, so that these need not be discussed herein.

The utilization of the present invention is not limited to the described alternatives of DPCM encoding, since it enables both a considerable reduction as well as the transmission of a plurality of control criteria and likewise allows the transmission of PCM encoded valus.

Although I have described my invention with reference to particular embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for transmitting differential pulse code modulation values by conversion into data words of different lengths, comprising the steps of:
   Converting a plurality of successive differential pulse code modulated values into data words of identical, optimally-minimum lengths; and
   Combining the data words with a preamble identifying their length to form a respective data block of constant length; and
   Transmitting the data block.

2. The method of claim 1, and further defined as comprising the step of:
   Transmitting an unused binary combination as a control signal in place of a differential pulse code modulated value converted into a data word.

3. The method of claim 1, and further defined by the step of:
   Forming a data block from a pulse code modulated signal value and an appertaining preamble; and
   Transmitting the pulse code modulated data block in place of the differential pulse code modulated values.

4. The method of claim 1, for run length coding, comprising the step of:
   Transmitting a plurality of differential pulse coded modulated values corresponding to the value 0 in a data block with an appertaining preamble.

5. The method of claim 1, for television transmission, and further defined by the step of:
   Transmitting a data block containing a synchronous word at the beginning of a television line.

6. The method claim 5, and further defined by the step of:
   Transmitting a predictor identifier in the data block in addition to the synchronizing word.

7. The method of claim 1, wherein the steps of combining and transmitting are further defined as:
   Combining a plurality of differential pulse coated modulation values and transmitting the same comprising two, three and four bits.

8. The method of claim 7, wherein the steps of combining and transmitting are further defined as:
   Combining and transmitting data blocks having a length of eleven bits.

9. The method of claim 8, and further comprising the steps of:
   Receiving the transmitted values;
   Converting the received data words into differential pulse code modulated values; and
   Reconstructing pulse code modulation signal values from the received differential pulse code modulated values.

10. The method of claim 8, and further defined as:
    Transmitting a block length of fourteen bits including a preamble of at least two bits.

* * * * *